(12) United States Patent
Radhakrishnan et al.

(10) Patent No.: US 12,308,362 B2
(45) Date of Patent: May 20, 2025

(54) PACKAGING ARCHITECTURE FOR DISAGGREGATED INTEGRATED VOLTAGE REGULATORS

(71) Applicant: Intel Corporation, Santa Clara, CA (US)

(72) Inventors: Kaladhar Radhakrishnan, Chandler, AZ (US); Krishna Bharath, Phoenix, AZ (US); William J. Lambert, Chandler, AZ (US); Adel A. Elsherbini, Tempe, AZ (US); Sriram Srinivasan, Chandler, AZ (US); Christopher Schaef, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 17/412,810

(22) Filed: Aug. 26, 2021

(65) Prior Publication Data
US 2023/0060727 A1    Mar. 2, 2023

(51) Int. Cl.
*H01L 23/00* (2006.01)
*H01L 25/00* (2006.01)
(Continued)

(52) U.S. Cl.
CPC ............. *H01L 25/18* (2013.01); *H01L 24/73* (2013.01); *H01L 25/0652* (2013.01);
(Continued)

(58) Field of Classification Search
CPC ..... H01L 25/18; H01L 24/73; H01L 25/0652; H01L 25/50; H01L 23/3128; H01L 23/3185; H01L 23/481; H01L 24/08; H01L 24/16; H01L 24/32; H01L 24/33; H01L 2224/08145; H01L 2224/16227; H01L 2224/32145; H01L 2224/32225; H01L 2224/33181; H01L 2224/73204; H01L 2224/73253; H01L 2924/1427; H01L 2924/19011; H01L 2924/19015; H01L 2924/19042; H01L 23/49816; H01L 23/50; H01L 23/5383; H01L 2223/6644;
(Continued)

(56) References Cited

U.S. PATENT DOCUMENTS

| | | |
|---|---|---|
| 11,101,228 B1 * | 8/2021 | Kim ............... H01L 23/49822 |
| 2020/0105653 A1 | 4/2020 | Elsherbini et al. |
| 2021/0104475 A1 | 4/2021 | Radhakrishnan et al. |

\* cited by examiner

*Primary Examiner* — Elias Ullah
(74) *Attorney, Agent, or Firm* — Akona IP PC

(57) ABSTRACT

A microelectronic assembly is provided comprising a first integrated circuit (IC) die having an electrical load circuit, a second IC die having a portion of a voltage regulator (VR), and a third IC die comprising inductors of the VR. The third IC die is between the first IC die and the second IC die, and the VR receives power at a first voltage and provides power at a second voltage to the electrical load circuit, the second voltage being lower than the first voltage. In various embodiments, the inductors in the third IC die comprise magnetic thin films. The third IC die may be a passive die without any active elements in some embodiments. In some embodiments, the microelectronic assembly further comprises a package substrate having conductive pathways, and the second IC die is between the third IC die and the package substrate.

20 Claims, 9 Drawing Sheets

(51) Int. Cl.
*H01L 25/065* (2023.01)
*H01L 25/18* (2023.01)
*H01L 23/31* (2006.01)
*H01L 23/48* (2006.01)

(52) U.S. Cl.
CPC .......... *H01L 25/50* (2013.01); *H01L 23/3128* (2013.01); *H01L 23/3185* (2013.01); *H01L 23/481* (2013.01); *H01L 24/08* (2013.01); *H01L 24/16* (2013.01); *H01L 24/32* (2013.01); *H01L 24/33* (2013.01); *H01L 2224/08145* (2013.01); *H01L 2224/16227* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01); *H01L 2924/1427* (2013.01); *H01L 2924/19011* (2013.01); *H01L 2924/19015* (2013.01); *H01L 2924/19042* (2013.01)

(58) Field of Classification Search
CPC . H01L 25/0655; H01L 25/0657; H01L 23/66; H01L 2223/6622; H01L 2224/16225; H01L 2924/181
See application file for complete search history.

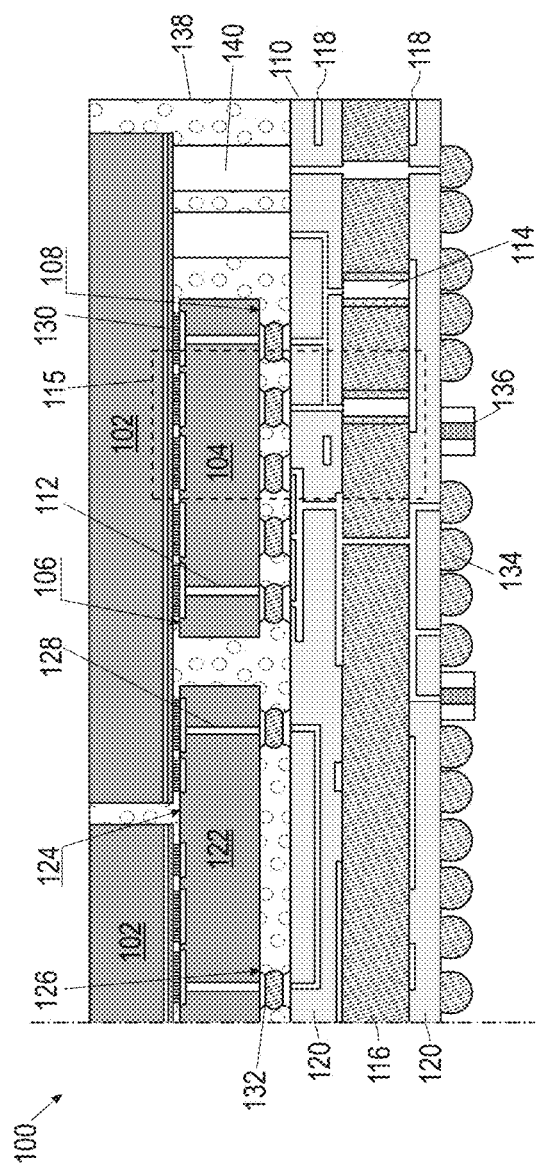
FIG. 1
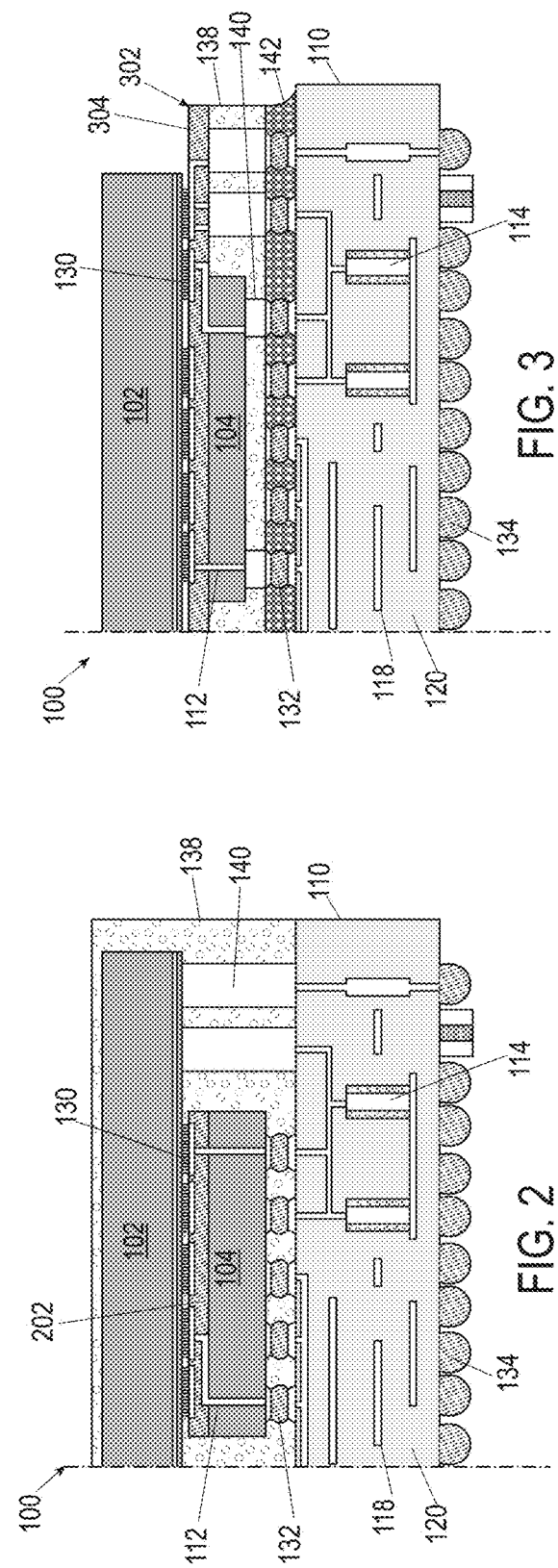
FIG. 3
FIG. 2

PACKAGING ARCHITECTURE FOR DISAGGREGATED INTEGRATED VOLTAGE REGULATORS

TECHNICAL FIELD

The present disclosure relates to techniques, methods, and apparatus directed to packaging architecture for disaggregated integrated voltage regulators (VRs).

BACKGROUND

Electronic circuits when fabricated on a wafer of semiconductor material, such as silicon, are commonly called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Components of such ICs operate at specific power ratings, voltages and/or currents. In many ICs, while current consumption is dynamic and depends on the load, the voltage is fixed and ideally constant for proper functioning of the components. The fixed voltage may be maintained with a VR. Linear VRs are transistor-based devices usually packaged as, or along with, ICs that use differential amplifiers to control output voltage against a reference voltage, typically with input current comparable to the output current. Switching VRs toggle a series device ON/OFF at high frequency, varying the duty cycle of voltage transferred as output. Their common topologies are buck (output voltage lower than input voltage), boost (output voltage higher than input voltage), and buck-boost. In an example of a typical computer, the VR converts 12V, 5V or 3.3V direct current (DC) from a power supply unit into lower operating voltages, such as 0.8V, 1V or 1.2V of the IC.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a cross-sectional view of an example microelectronic assembly having an IC packaging architecture with disaggregated VRs according to some embodiments of the present disclosure.

FIG. 2 is a cross-sectional view of another example microelectronic assembly having an IC packaging architecture with disaggregated VRs, according to some embodiments of the present disclosure.

FIG. 3 is a cross-sectional view of yet another example microelectronic assembly having an IC packaging architecture with disaggregated VRs, according to some embodiments of the present disclosure.

DETAILED DESCRIPTION

Overview

Figure 4:
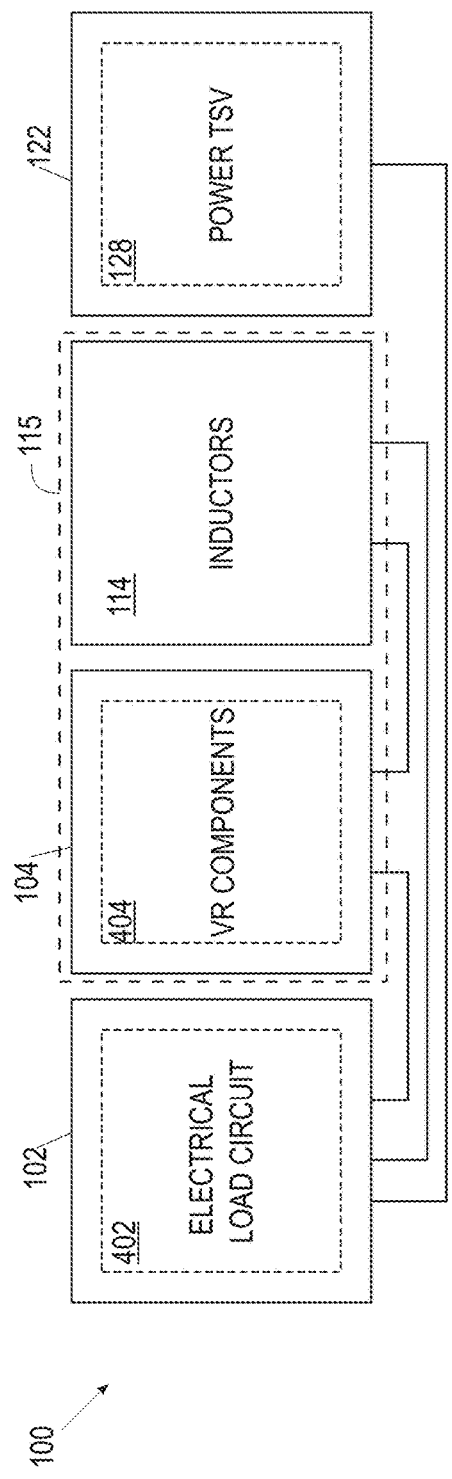
FIG. 4 is a simplified block diagram of an example disaggregated VR configuration, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

In a general sense, a basic VR circuit implemented as a buck converter comprises a power supply (e.g., battery) that delivers power at a high voltage (e.g., 12V) to a metal-oxide semiconductor field effect transistor (MOSFET) switch. The switch is connected to an electrical load operating at a low voltage (e.g., 1.2V) with an intermediate inductor that acts as a choke. It may be noted that the term "electrical load" as used herein refers to a portion of an IC that consumes electrical energy, for example, a processor such as a central processing unit (CPU). When the switch is closed, the voltage on an input side of the inductor closer to the power supply becomes 12V but the voltage at the output side of the inductor connected to the electrical load does not change instantaneously. Instead, the inductor resists the change in current, building up a magnetic field, which creates a voltage drop at its output. When the switch is opened, the voltage at the input to the inductor drops to 0 V. The inductor's magnetic field that was built up during charging starts to collapse, generating current at its output, which is fed to the electrical load. By opening and closing the switch appropriately, for example, by a suitable controller using pulse width modulation (PWM), the voltage at the output of the inductor connected to the electrical load can be maintained at an average of around 1.2V. It may be noted that the above description briefly explains basic VR circuitry, whereas actual implementation in ICs will include many more components such as capacitors, diodes, feedback circuits, analog to digital converters (ADCs) and digital to analog converters (DACs).

Integrated buck converters, such as Fully Integrated Voltage Regulator (FIVR), are used in datacenter processors to reduce resistive power loss ($I^2R$ loss) where power is supplied at a high voltage. As datacenter products trend toward higher thermal design power (TDP), the ability to bring power in at even higher voltages (e.g., 5V or higher) grows in value. However, current FIVRs traditionally operate lower voltage levels (e.g., around 1.8V). They also have the disadvantage that advanced process nodes used for manufacturing datacenter processors are not capable of supporting higher voltages without substantial cost in area and reduced conversion efficiency. Further, there is a trend toward eliminating non-compute related transistor area due to reduced yields on these advanced nodes. Achieving higher voltage conversion may be possible using custom devices based on gallium nitride (GaN) that can natively block high voltages, and/or higher power inductors and capacitors. However, these solutions are not only more expensive, but they also cannot be integrated into a single IC die.

Integrated buck converters, such as a Fully Integrated Voltage Regulator (FIVR), are used in datacenter processors to reduce resistive power loss ($I^2R$ loss) where power is supplied at a high voltage. As datacenter products trend toward higher thermal design power (TDP), the ability to bring power in at even higher voltages (e.g., 5V or higher) grows in value. However, current FIVRs traditionally operate at lower voltage levels (e.g., around 1.8V). They also have the disadvantage that advanced process nodes used for manufacturing datacenter processors are not capable of supporting higher voltages without substantial cost in area and reduced conversion efficiency. Further, there is a trend toward eliminating non-compute related transistor area due to reduced yields on these advanced nodes. Achieving higher voltage conversion may be possible using custom devices based on gallium nitride (GaN) that can natively block high voltages, and/or higher power inductors and capacitors. However, these solutions are not only more expensive, but they also cannot be integrated into a single IC die.

On-package high-voltage discrete VRs provide many of the benefits of high-voltage FIVR. For example, they allow for the reduction of overall through-platform $I^2R$ losses and reduce socket pin count. However, they have several disadvantages, such as: increased $I^2R$ and load-line related losses from lateral power distribution on the package; reduced area available for compute blocks on the package due to the area occupied by the VR dies and their supporting passives; and inability to perform fine-grained power management (PM) without the addition of a low drop-out regulator (LDO) stage (thus not totally eliminating the area required for integrated regulation).

Another example packaging architecture for disaggregated IVRs includes a package having a first die comprising an electrical load circuit, and a second die comprising an IVR, including inductors, between the first chip and a package substrate. In some embodiments, capacitors associated with the IVR are disposed in the first die. In other embodiments, the capacitors are disposed in the second die. In various embodiments, the inductors are stacked in layers in the second die. In other embodiments, multiple second dies are stacked in layers within the package.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The term "circuit" and "circuitry" mean one or more passive and/or active components that are arranged to cooperate with one another to provide a desired function. As used herein, these terms also refer to analog circuitry, digital circuitry, hard wired circuitry, programmable circuitry, microcontroller circuitry and/or any other type of physical hardware electrical and/or electronic component. As used herein, the term "active element" refers to any circuit component that can enhance the energy level of a signal passing through it; the active element can control and/or amplify the flow of electric current through a circuit, as opposed to a passive element that merely consumes and/or stores electrical power and/or scales down the amount of current flow. Examples of active elements include transistors and diodes.

The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulating material (e.g., a low-k dielectric material) that is provided within the plane of a die. Such traces are typically stacked into several levels, or several layers, of metallization stacks. On the other hand, the term "via" may be used to describe an electrically conductive element that interconnects two or more traces at different levels. To that end, a via may be provided substantially perpendicularly to the plane of a die and may interconnect two traces in adjacent levels or two traces in not adjacent levels. The term "metallization stack" may be used to refer to a stack of one or more interconnects for providing connectivity to different circuit components of a die. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional illustration of a portion of a microelectronic assembly 100, according to some embodiments of the present disclosure. Microelectronic assembly 100 may include one or more load-die 102, comprising electrical load circuits that consume power.

Examples of such electrical load circuits include CPUs, graphics processor units (GPUs) and the like.

A VR die 104 having two sides 106 and 108 may be electrically coupled to load-die 102 on side 106 and to a package substrate 110 on side 108. In various embodiments, side 108 may comprise active elements (e.g., devices such as transistors) of VR die 104; in such embodiments, electrical coupling to side 106, which forms the "backside" of VR die 104 may be achieved using TSVs 112. Interconnection with load-die 102 may be in a front-to-back (F2B) configuration, the "frontside" of load-die 102 comprising active elements being proximate to side 106 (the "backside") of VR 104. In other embodiments, side 106 may comprise the active elements of VR die 104; in such embodiments, interconnection with load-die 102 may be in a front-to-front (F2F) configuration, with the active elements of both dies being proximate to each other.

In some embodiments VR die 104 may comprise a monolithic IC with electrical circuits that function similar to a power management IC (PMIC), including powertrain drivers, phase width modulation signal generators, compensator, phased locked loop (PLL), fuses, state controllers, etc. and may communicate with load-die 102 over an industry standard serial protocol bus, such as 12C. In other embodiments, VR die 104 may contain fewer circuits than are found in typical PMICs, for example, limited to high-voltage analog circuits, with other digital and low-voltage analog circuits located in load-die 102. In both configurations, VR die 104 may be fabricated using a semiconductor manufacturing process different from that used to fabricate load-die 102. For example, load-die 102 may be fabricated using an advanced node processing, whereas VR die 104 may be fabricated using a process tailored for high-voltage products, such as components that can tolerate input voltages ranging from 1.8V to 12V.

Package substrate 110 may comprise one or more inductors 114 electrically coupled to VR die 104 and load-die 102. In various embodiments, VR die 104 and inductors 114 may together function as a VR 115, regulating (e.g., decreasing or increasing) an input voltage at package substrate 110 to a different value at the electrical load circuits in load-die 102. In some embodiments, package substrate 110 may comprise a core 116 with conductive pathways 118 in metal layers alternating with insulating layers 120 having conductive vias interconnecting the metal layers. In some embodiments in which core 116 comprises glass-reinforced epoxy, conductive pathways 118 in metal layers and insulating layers 120 may be situated on either side of core 116 (as shown). In other embodiments, package substrate 110 may not comprise core 116, and instead have layers of metal layers comprising conductive pathways 118 alternating with insulating layers 120 having conductive vias therethrough. In such embodiments, inductors 114 may be distributed across multiple metal layers and insulating layers 120. In other such embodiments, inductors 114 may be in a single metal layer or insulating layer. In still other embodiments in which package substrate 110 comprises a semiconductor chip, core 116 may comprise silicon, insulating layers 120 may comprise inter-layer dielectric (ILD), and conductive pathways 118 in metal layers (e.g., copper or aluminum) may be disposed in a metallization stack on core 116.

In some embodiments, package substrate 110 may comprise fire retardant grade 4 (FR-4) glass epoxy base core 116 with thin copper foil laminated on either side. For certain embodiments, a multilayer printed circuit board (PCB) may be used with copper foil and prepreg to make additional layers of metal comprising conductive pathways 118 and insulator 120, respectively. In particular, when package substrate 110 is formed using standard PCB processes, package substrate 110 may include FR-4, and conductive pathways 118 may be formed by patterned sheets of copper separated by built-up layers 120 of the FR-4. Conductive pathways 118 may comprise copper (or other conductive metal) traces, lines, pads, vias, via pads, holes and/or planes. Conductive pathways 118 may be bordered by liner materials, such as adhesion liners and/or barrier liners, as suitable. In some embodiments, package substrate 110 may be formed using a lithographically defined via packaging process. In some embodiments, package substrate 110 may be manufactured using standard organic package manufacturing processes, and thus package substrate 110 may take the form of an organic package. Any method known in the art for fabrication of package substrate 110 may be used, and for the sake of brevity, such methods will not be discussed in further detail herein.

In some embodiments, insulating layers 120 may comprise built-up layers of epoxy resin (and/or other organic polymer material). In some embodiments, insulating layers 120 may comprise bismaleimide-triazine (BT) resin, polyimide materials, glass-reinforced epoxy matrix materials, organic dielectrics with inorganic fillers or low-k and ultra-low-k dielectric (e.g., carbon-doped dielectrics, fluorine-doped dielectrics, porous dielectrics, and organic polymeric dielectrics). In other embodiments, insulating layers 120 may comprise a ceramic (and/or other insulating inorganic material).

In various embodiments, inductors 114 may be configured to operate at input voltages greater than 1.8 V and switching frequencies lower than 50 MHz. In some embodiments, inductors 114 may comprise coaxial magnetic inductors layer (MIL) structure embedded within core 116 or insulating layers 120 of package substrate 110. In some of such embodiments, the coaxial MIL structure may include a copper-lined plated through-hole (PTH) surrounded by a high permeability magnetic material such as magnetic resin. The magnetic resin may further include ferrite particle fillers. In other such embodiments, the coaxial MIL structure may comprise a ferrite core with a cylindrical shell. In yet other such embodiments, inductors 114 may comprise magnetic interconnects (or magnetic cores, ferrite cores, etc.) that may be manufactured in the shape of a hollow cylindrical shell (or the like), embedded and/or otherwise disposed in core 116 or insulating layers 120 of package substrate 110, where the magnetic interconnects surround copper filled PTH vias. In other embodiments, inductors 114 may comprise planar MIL structures.

In various embodiments, the magnetic materials of inductors 114 may include one of more ferromagnetic (or ferrimagnetic) materials, including (but not limited to), cobalt, iron, iron oxide (e.g., ferric oxide and/or ferrous oxide), oxides and other compounds of iron, nickel, copper, magnesium, manganese, bismuth, antimony, yttrium, chromium, arsenic, cadmium, zinc, telluride (e.g., $FeOFe_2O_3$, NiO, CuO, MgO, $CuOFe_2O_3$, $MgOFe_2O_3$, $Y_3Fe_5O_{12}$, MnSb, $CrO_2$, MnAs, CdZnTe). In some embodiments, the magnetic materials of the magnetic interconnects comprising inductors 114 may be conductive metal alloys disposed as thin laminated layers (e.g., fabricated in situ during manufacture of package substrate 110 or forming of mold compound 138 around VR die 104), electrodeposited or sputtered ferrites, spin-spray ferrites, high resistivity oxides in bulk form, air-core inductors (ACI), or microparticles dispersed in an epoxy resin medium and the like.

Although the example embodiment shown in FIG. 1 and subsequent figures have inductors 114 embedded in package substrate 110, insulator 110 may also be disposed on a surface of package substrate 110, for example, in the form of an integrated component, or a discrete soldered component in other embodiments. For example, inductors 114 may comprise embedded magnetic sheets, or magnetic inductor arrays (MIAs). In another example, inductors 114 may be placed on a landside of package substrate 110, opposite to a side where VR die 104 is located.

In embodiments where multiple ones of load-die 102 are used, for example, in large processor applications, one load-die 102 may be connected to another load-die 102 with a bridge die 122. Bridge die 122 may have two opposing sides 124 and 126 may be coupled to more than one load-die 102 on side 124 and to package substrate 110 on side 126. Bridge die 122 may comprise one or more TSVs 128, for example, for delivering power to load-die 102. In some embodiments, bridge die 122 may be a passive die without any active elements therein. In other components, bridge die 122 may include active elements either proximate side 124 or proximate side 126.

In various embodiments, any load-die 102 may be electrically coupled to VR die 104 and bridge die 120 with die-to-die (DTD) interconnects 130. In some embodiments, a pitch (e.g., center-to-center distance between adjacent interconnects) of DTD interconnects 130 coupling load-die 102 to VR die 104 may be substantially lower than the pitch of DTD interconnects 130 coupling load-die 102 to bridge die 122. For example, DTD interconnects 130 between load-die 102 and bridge die 122 may comprise 1600 connections at a pitch of 25 micrometer or smaller, whereas DTD interconnects 130 between load-die 102 and VR die 104 may comprise a pitch of 50 micrometer or greater. In other embodiments, the pitch of DTD interconnects 130 between load-die 102 and VR die 104 may be substantially the same as the pitch of DTD interconnects 130 between load-die 102 and bridge die 122.

VR die 104 and bridge die 120 may be electrically coupled to package substrate 110 with die-to-package-substrate (DTPS) interconnects 132. Package substrate 110 may be electrically coupled to other system components, such as a PCB (not shown) with interconnects 134. In some embodiments, decoupling capacitors 136 may be located on package substrate 110, for example, at an input side of the power delivered to package substrate 110. In some embodiments, decoupling capacitors 136 may comprise discrete surface mounted components; in other embodiments, decoupling capacitors 136 may comprise integrated capacitors within package substrate 110, for example, fabricated using thin-film capacitor technology processes known in the art. Any suitable type of capacitor may be used as decoupling capacitor 136 within the broad scope of the embodiments described herein.

In some embodiments, in addition to discrete die side and landside attached decoupling capacitors such as capacitor 136, VR 115 may use some form of high-voltage high-frequency decoupling capacitors at its input side, for example, to reduce input switching ripple and transient noise. Such input-side decoupling capacitors may be included as metal-insulator-metal (MIM) capacitors in VR die 104, load-die 102, or integrated as thin-film capacitors in package substrate 110.

In various embodiments, load-die 102, VR die 104, and bridge die 122 may be embedded, or otherwise disposed, in a mold compound 138. Through-dielectric vias (TDVs) 140 may provide direct electrical coupling between load-die 102 and package substrate 110. Note that TDVs may also be known as through-mold vias (TMVs). In some embodiments, TDVs 140 may comprise copper pillars. In other embodiments, TDVs 140 may comprise plated through-holes. A backside of microelectronic assembly 100 may be ground to expose surfaces of load-die 102 for attaching heat sink or other components as needed. In some embodiments, mold compound 138 may form an interposer in which VR die 104 and bridge die 122 may be embedded or otherwise disposed. In such embodiments, VR die 104 and bridge die 122 may be attached to a carrier wafer, TDVs 140 (e.g., copper pillars) and other metallization deposited as needed, then mold compound disposed around TDVs 140, VR die 104 and bridge die 122 and cured to form the interposer. In other embodiments, VR die 104 and bridge die 122 may be attached to a carrier wafer, mold compound disposed around them as appropriate, cured, and then TDVs 140 and conductive traces fabricated using laser drilling and electroplating, among other processes. Any appropriate manufacturing process known in the art may be used to generate the structure illustrated in FIG. 1. Note that, for the sake of clarity and not to clutter the drawings, additional features such as vias, traces, pads, and interconnects (among others) of microelectronic assembly 100 are not shown.

In some embodiments, load-die 102, VR die 104, and bridge die 122 may comprise substantially monocrystalline semiconductors, such as silicon or germanium as a substrate on which active devices are fabricated with traditional semiconductor processing methods. In some other embodiments, the substrates of load-die 102, VR die 104, and bridge die 122 may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In yet other embodiments, the substrates may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the substrates may comprise an intrinsic IV or III-V semiconductor material or alloy, not intentionally doped with any electrically active impurity; in alternate embodiments, nominal impurity dopant levels may be present. In still other embodiments, the substrates may comprise be organic materials such as silica-filled epoxy. In other embodiments, the substrates may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the substrates may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

In various embodiments, one or more of die 102, VR 104 and bridge die 122 may include, or be a part of, one or more of a CPU, a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express (PCIe) circuitry, Double Data Rate transfer circuitry, or other electronic components known in the art.

Although not specifically shown in all of the present illustrations in order to not clutter the drawings, when DTD or DTPS interconnects are described, a surface of a first die (e.g., load-die 102) may include a first set of conductive contacts, and a surface of a second die (e.g., VR die 104) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects (e.g., 130) may be different from the pitch of the DTPS interconnects (e.g., 132), although, in other embodiments, these pitches may be substantially the same. In some embodiments, the DTPS interconnects disclosed herein may have a pitch between about 80 micrometer and 300 micrometers, while the DTD interconnects disclosed herein may have a pitch between about 0.7 micrometer and 100 micrometers.

The DTPS interconnects (e.g., 132) disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects as described herein may comprise DTD interconnects 130 such as hybrid bond interconnects, metal-to-metal interconnects (e.g., copper-to-copper interconnects, or plated interconnects). In other embodiments, the DTD interconnects may be solder bumps (e.g., C4 bumps) or microbumps (e.g., C2 bumps). In embodiments where DTD interconnects comprise metal-to-metal bonds, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others. Note that in FIG. 1 and in subsequent figures, the DTD and DTPS interconnects are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering. For example, through-connections may have pads on top of them and may land on larger pads on the top dies.

In packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

Note that FIG. 1 is intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIG. 1 may include more dies along with other electrical components. Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

FIG. 2 is a simplified cross-sectional view of a portion of an example embodiment of microelectronic assembly 100. VR die 104 may comprise a redistribution layer (RDL) 202 that can route current from one area of the RDL to another area. For example, RDL 202 can enable fanning out electrical connections from TSVs 112 to DTD interconnects 130 that are not directly over TSVs 112 but located elsewhere between load-die 102 and VR die 104. In another example, RDL 202 can enable fanning out electrical connection from one of DTD interconnects 130 to another of DTD interconnects 130. In various embodiments, RDL 202 can reroute electrical connections exclusively for a voltage rail (e.g., voltage supply) generated by components of VR 115 in VR die 104. In other embodiments, RDL 202 can reroute electrical connections for voltage rails generated elsewhere in microelectronic assembly 100, for example, in an external power management IC (PMIC) attached to package substrate 110.

Due to the location of VR die 104 between load-die 102 and package substrate 110, power to some circuits in load-die 102 (for example, circuits located proximate to VR die 104) from package substrate 110 may be blocked by VR die 102 without RDL 202. RDL 202 may enable power to be delivered to these circuits through TSVs 112 and the appropriate ones of DTD interconnects 130.

FIG. 3 is a simplified cross-sectional view of a portion of an example embodiment of microelectronic assembly 100. Microelectronic assembly 100 may comprise an interposer 302 comprising an RDL 304 thereon. In various embodiments, interposer 302 may be similarly sized as or larger than load-die 102. VR die 104 may be embedded in interposer 302, for example, with TSVs 112 connected to corresponding TDVs 140 in interposer 302. Interposer 302 may comprise a discrete component coupled electrically and mechanically to load-die 102 with DTD interconnects 130 and to package substrate 110 with DTPS interconnects 132. Interposer 302 may be fabricated in wafer form, for example, by spinning mold compound 138 around VR die 104 (and/or bridge die 122 as appropriate), and other metallization, such as copper pillars, followed by curing and singulating into individual "dies." In another example process, interposer 302 may be fabricated with a cutout therein, into which VR die 104 (and/or bridge die 122 as appropriate) may be attached, followed by additional deposition of mold compound 138 suitably. An underfill 142 between interposer 302 and package substrate 110 may provide thermo-mechanical stability and reliability to DTPS interconnects 132. In contrast to microelectronic assembly 100 as shown in FIG. 2, in which RDL 202 enables fanning out power delivered through TSVs 112 to DTD interconnects 130 between VR die 104 and load-die 102, RDL 304 may enable fanning out power delivered from package substrate 110 to load-die 102 through any of TSVs 112 and TDVs 140 to any of DTD interconnects 130 between load-die 102 and interposer 302.

FIG. 4 is a simplified block diagram of an embodiment of microelectronic assembly 100. Electrical load circuits 404 in load-die 102 may be electrically coupled to VR components 404 in VR die 104. Inductors 114 may be coupled at their input to VR components 404 and at their outputs to electrical load circuits 404. VR components 404 may comprise PMIC-like circuits, including powertrain drivers, PWM signal generators, compensator, PLL, fuses, state controllers, etc. Power TSVs 128 in bridge die 122 may facilitate power delivery to electrical load circuits 404, for example, from another load-die 102. VR components 404 and inductors 114 may together function as VR 115, receiving power at high voltage and delivering it at lower voltage to electrical load circuits 402.

Figure 5:
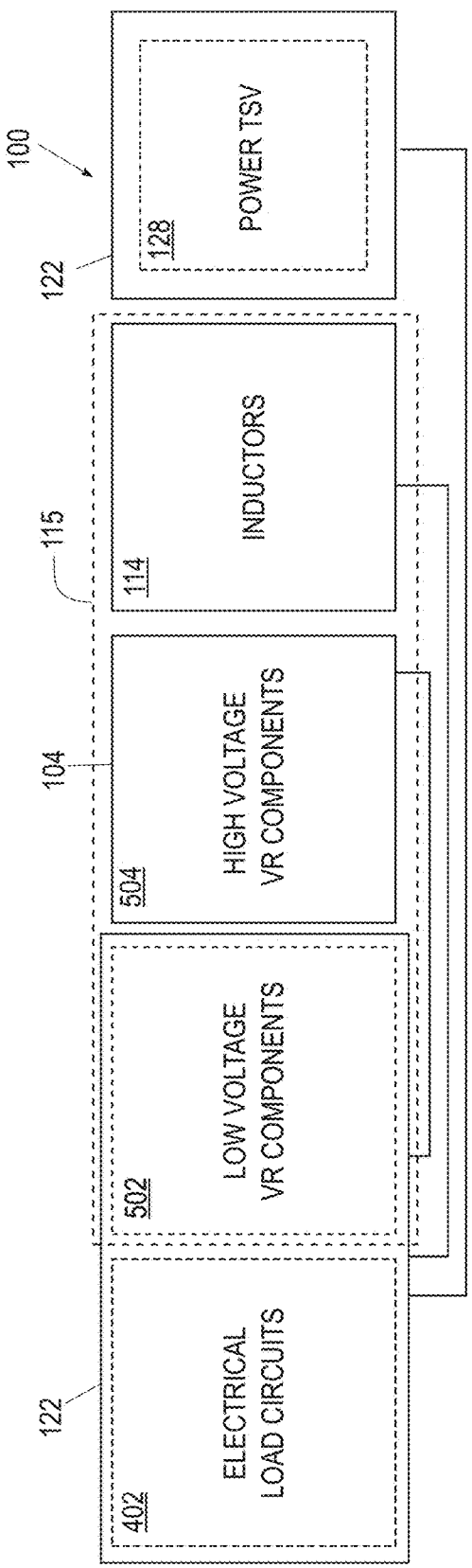
FIG. 5 is a simplified block diagram of another example disaggregated VR configuration, according to some embodiments of the present disclosure.

FIG. 5 is a simplified block diagram of another embodiment of microelectronic assembly 100. VR components 404 may be split into two: low-voltage VR components 502 and high-voltage VR components 504. Low-voltage VR components 502 may be located in load-die 102 proximate to electrical load circuits 404. In some embodiments, low-voltage VR components 502 may comprise digital and low-voltage analog circuits of VR 115. High-voltage VR components 504 (e.g., powertrain phases) may be disposed in VR die 104. Low-voltage VR components 502, high-voltage VR components 504, and inductors 114 may together function as VR 115.

Figure 6:
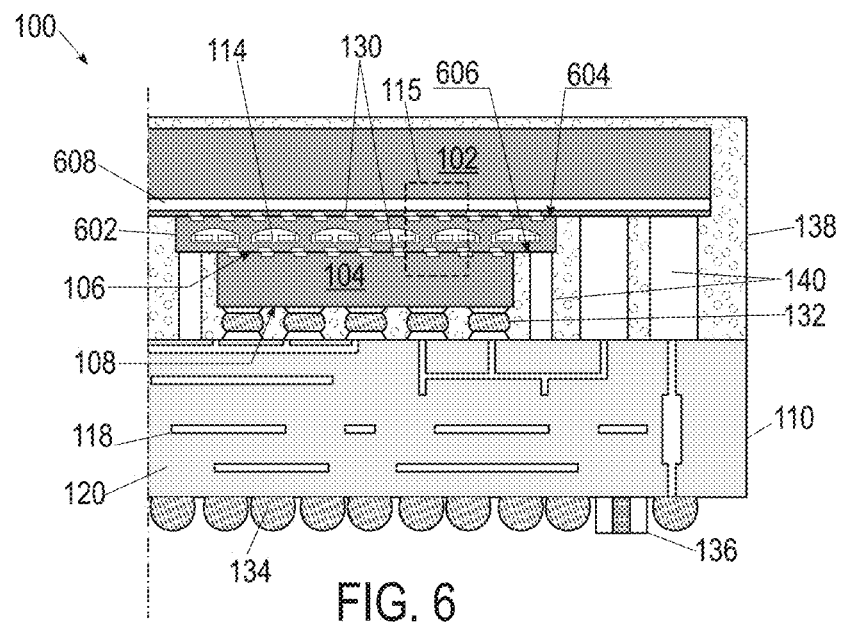
FIG. 6 is a cross-sectional view of an example microelectronic assembly comprising passive dies with integrated inductors according to some embodiments of the present disclosure.

FIG. 6 is a simplified cross-sectional view of a portion of an example embodiment of a microelectronic assembly 100. A passive die 602 may be sandwiched between load-die 102 and VR die 104. For example, a side 604 of passive die 602 may be proximate to load-die 102 and an opposite side 606 may be proximate to VR die 104. In various embodiments, passive die 602 may be similarly sized as VR die 104. In some embodiments, passive die 602 may be of substantially same size as VR die 104. In other embodiments, passive die 602 may be larger than or smaller than VR die 104 by around 10%-20%. Inductors 114 may be located in passive die 602. Moving inductors 114 away from package substrate 110 or load-die 102 may serve to minimize radio frequency interference (RFI) risk to sensitive circuits. In some embodiments, inductors 114 may be fabricated using magnetic thin films, such as permalloy or cobalt zirconium tantalum (CZT) films. For example, inductors 114 may be in the form of a spiral fabricated on a semiconductor substrate using electrochemical deposition, chemical vapor deposition (CVD), etching, sputter deposition, spin coating, and other suitable processes known in the art. In other embodiments, inductors 114 may be fabricated using complementary metal-oxide-semiconductor (CMOS) processes used in standard semiconductor IC manufacturing, with additional magnetic materials, such as amorphous cobalt alloy with insulating laminations in a core, surrounded by silicon oxide insulator and conductive materials such as copper.

In such embodiments, VR 115 may comprise inductors 114 located in passive die 602, and VR components located in VR die 104. Output decoupling may be achieved using MIM capacitors 608 located in load-die 102. In some embodiments, decoupling capacitors 136 may be located on package substrate 110, for example, at an input side of the power delivered to package substrate 110. In other embodiments, decoupling capacitors may be implemented as MIM capacitors inside VR die 104 or through the use of thin-film capacitor technology in package substrate 110.

Direct current (DC) to DC converters may be implemented entirely off package in such embodiments, using multiple power trains, controllers, inductors, and capacitors. VR die 104 may be fully autonomous, including features such as power train, drivers, and controllers in some embodiments, for example, as shown in FIG. 4. In other embodiments (e.g., as shown in FIG. 5), VR die 104 may include high-power VR components, whereas low-power digital and analog components may be located in load-die 102.

In various embodiments, passive die 602 and VR die 104 may be first assembled in wafer form, for example, as a reconstituted wafer with mold compound 138 and TDVs 140 surrounding VR die 104 and passive die 602, and then tested for functionality, performance, and manufacturing defects before being singulated and assembled in microelectronic assembly 100 with load-die 102 (using DTD interconnects 130) and package substrate 110 (using DTPS interconnects 132) in another reconstituted form, with additional mold compound 138 and TDVs 140 added as needed.

Figure 7:
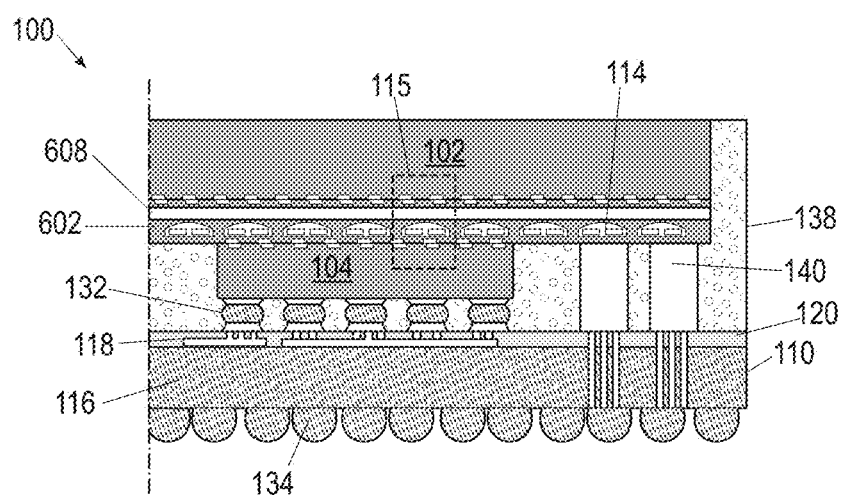
FIG. 7 is a cross-sectional view of another example microelectronic assembly comprising passive dies with integrated inductors, according to some embodiments of the present disclosure.

FIG. 7 is a simplified cross-sectional view of a portion of an example embodiment of a microelectronic assembly 100. In the example embodiment, MIM capacitors 608 may be located in passive die 602. In some embodiments, passive die 602 may be similarly sized as load-die 102. In some embodiments, passive die 602 may be of substantially same size as load-die 102. In other embodiments, passive die 602 may be larger than or smaller than load-die 104 by around 10%-20%. Passive die 602 may incorporate inductors 114 in addition to capacitors 608 for output decoupling. Such embodiments may be used in situations where processing methods used to fabricate load-die 102 may not be amenable for high-density or affordable MIM capacitors. In various embodiments (e.g., as shown), package substrate 110 may comprise a semiconductor interposer, in which, for example, core 116 comprises silicon, insulator layers 120 comprise ILD, and conductive pathways 118 in metal layers are disposed in a metallization stack over core 116. TSVs through core 116 may facilitate electrical interconnection with interconnects 134 disposed on a face of package substrate 110 opposite to VR die 104. In such embodiments, passive die 602 and VR die 104 may be sorted with a suitable test (e.g., HoP or equivalent), and load-die 102 may be tested separately (e.g., with software-defined test and measurement (SDx) or equivalent). Known-good dies (KGDs) are then assembled together on package substrate 110 to form microelectronic assembly 100. In another embodiment, passive die 602 may be coupled to load-die 102 in wafer form, tested, singulated and then assembled with VR die 104 in microelectronic assembly 100 suitably.

Figure 8:
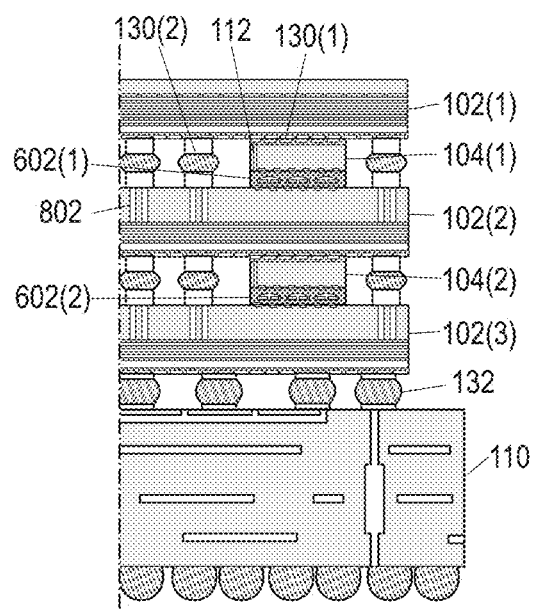
FIG. 8 is a cross-sectional view of yet another example microelectronic assembly comprising passive dies with integrated inductors, according to some embodiments of the present disclosure.

FIG. 8 is a simplified cross-sectional view of a portion of an example embodiment of a microelectronic assembly 100. Multiple load-dies 102 may be stacked along their thicknesses, with VR dies 104 and passive dies 602 in between them. In some embodiments, DTD interconnects 130(1) between load-die 102(1) and VR die 104(1) may comprise hybrid bond interconnects, whereas DTD interconnects 130(2) between load-die 102(1) and another load-die 102(2) may comprise micro-bumps, such as soldered copper pillars (e.g., C2 bumps). In some embodiments, DTD interconnects 130(1) may also comprise anisotropic conductive films or any of the other types of DTD interconnects described with reference to previous figures. In such embodiments, load-dies (e.g., 102(2)-10(3)) between the uppermost load-die (e.g., 102(1)) and package substrate 110 may comprise TSVs 802 to facilitate power delivery between package substrate 110 and the uppermost load-die (e.g., 102(1)). The lowermost load-die (e.g., 102(3)) may be coupled to package substrate 110 with DTPS interconnects 132. In some embodiments, power delivery to circuits in load-dies (e.g., 102(1)-102(3)) proximate to VR dies (e.g., 104(1), 104(2)) may also be performed using TSVs 112 in the VR dies (e.g., 104(1), 104(2)), thus avoiding perforating any of the load-dies (e.g., 102(1)-102(3)) with the supply voltage (e.g., Vcc) of another load-die.

Figure 9:
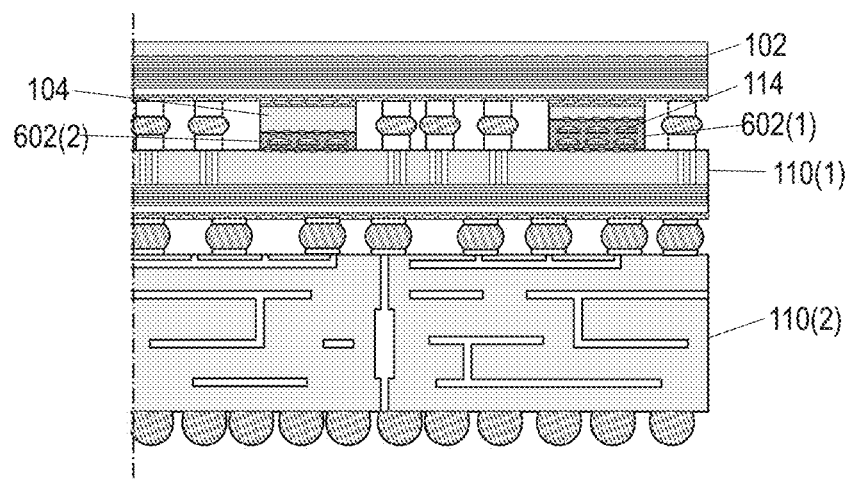
FIG. 9 is a cross-sectional view of yet another example microelectronic assembly comprising passive dies with integrated inductors, according to some embodiments of the present disclosure.

FIG. 9 is a simplified cross-sectional view of a portion of an example embodiment of a microelectronic assembly 100. In the example embodiment, two passive dies 602(1) and 602(2) may have inductors 114 configured in different ways. For example, in passive die 602(1), inductors 114 may be stacked within the die, whereas in passive die 602(2), inductors 114 may not be stacked. In some embodiments, in inductors 114 in passive die 602(1) may have multiple turns, for example, along a vertical direction with respect to the orientation of components shown in the figure. Such packing of inductors 114 within a single passive die (e.g., 602(1)) can enable improved inductor density and/or increased efficiency as a result of phase shedding (e.g., reduced number of phases).

In various embodiments, any of the features discussed with reference to any of FIGS. 1-9 herein may be combined with any other features to form a package with one or more ICs as described herein, for example, to form a modified microelectronic assembly 100. Some such combinations are described above, but, in various embodiments, further combinations and modifications are possible.

Example Methods

Figure 10:
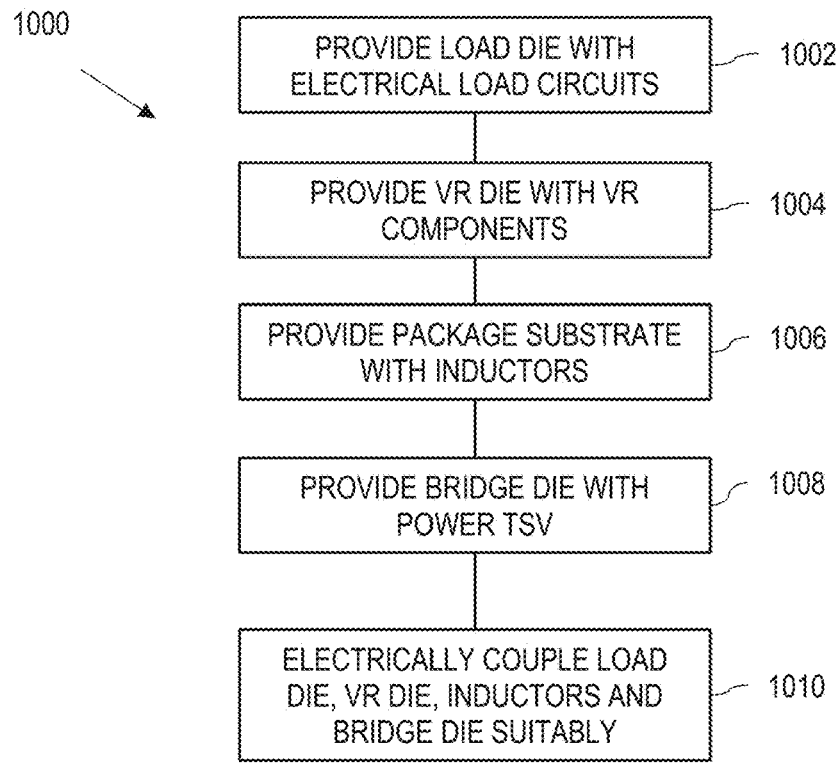
FIG. 10 is a flow diagram of an example method of making a microelectronic assembly, according to various embodiments of the present disclosure.

FIG. 10 is a flow diagram of an example method 1000 of fabricating a microelectronic assembly 100, according to various embodiments of the present disclosure. At 1002, load-die 102 may be provided with electrical load circuits 402. At 1004, VR die 104 may be provided with VR components 404. In various embodiments, VR die 104 may be fabricated using a different manufacturing process compared to load-die 102. For example, load-die 102 may be fabricated using an advanced semiconductor processing technology, whereas VR die 104 may be fabricated using a less advanced processing technology suitable for high-power or high-voltage components. At 1006, package substrate 110 may be provided with inductors 114. At 1008, bridge die 122 may be provided with TSVs 128. At 1010, load-die 102, VR die 104, inductors 114 and bridge die 122 may be suitably electrically coupled to form VR 115. In various embodiments, VR 115 may take an input at package substrate 110 having a first voltage and convert it into an output having a second voltage that is delivered to electrical load circuits 402. The second voltage may be lower than the first voltage in various embodiments in which VR 115 functions as a buck regulator or step-down regulator.

Figure 11:
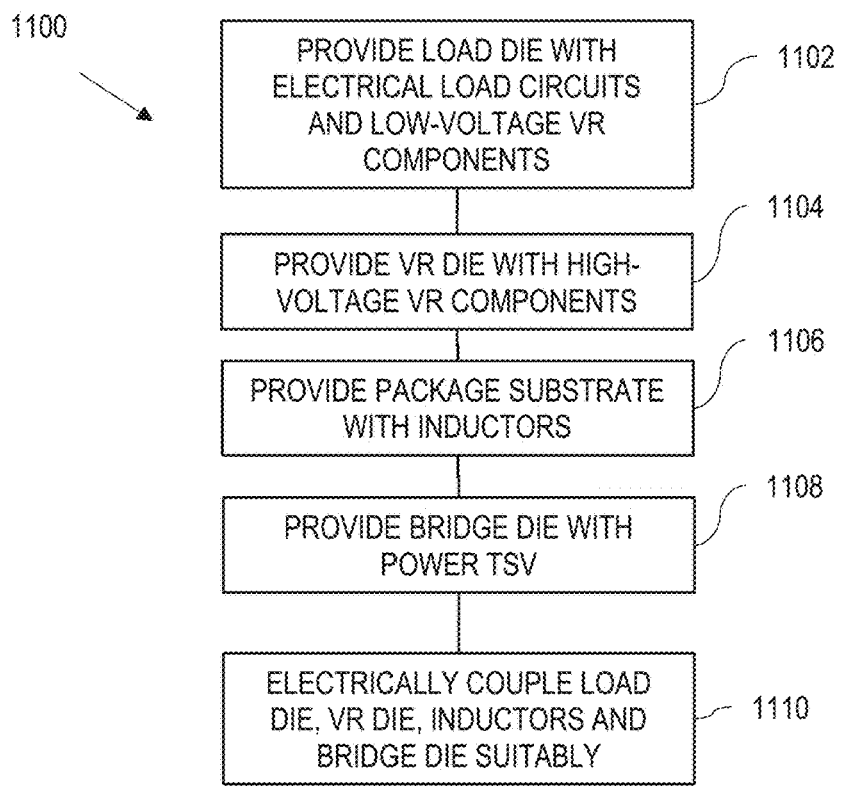
FIG. 11 is a flow diagram of another example method of making a microelectronic assembly, according to various embodiments of the present disclosure.

FIG. 11 is a flow diagram of an example method 1100 of fabricating a microelectronic assembly 100, according to various embodiments of the present disclosure. At 1102, load-die 102 may be provided with electrical load circuits 402 and low-voltage VR components 502. At 1104, VR die 104 may be provided with high-voltage VR components 504. At 1106, package substrate 110 may be provided with inductors 114. At 1108, bridge die 122 may be provided with TSVs 128. At 1010, load-die 102, VR die 104, inductors 114 and bridge die 122 may be suitably electrically coupled to form VR 115. In various embodiments, VR 115 may take an input at package substrate 110 having a first voltage and convert it into an output having a second voltage that is delivered to electrical load circuits 402. The second voltage may be lower than the first voltage in various embodiments in which VR 115 functions as a buck regulator or step-down regulator.

Figure 12:
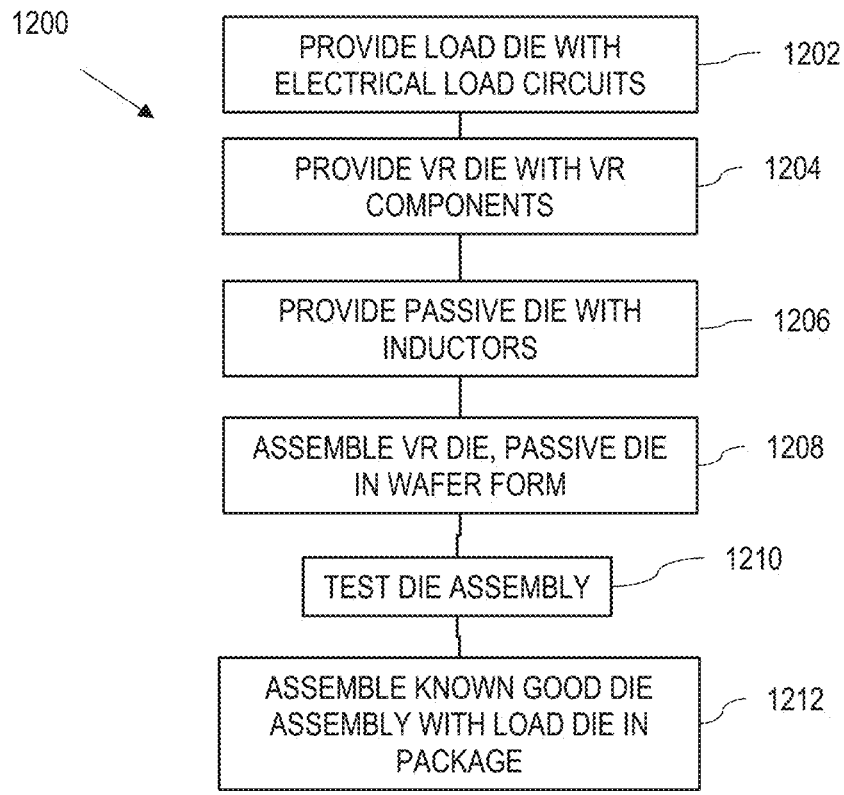
FIG. 12 is a flow diagram of yet another example method of making a microelectronic assembly, according to various embodiments of the present disclosure.

FIG. 12 is a flow diagram of an example method 1200 of fabricating a microelectronic assembly 100, according to various embodiments of the present disclosure, in which passive die 602 is substantially similarly sized as VR die 104 (e.g., as shown in FIG. 6). At 1202, load-die 102 may be provided with electrical load circuits 402. At 1204, VR die 104 may be provided with VR components 404. At 1206, passive die 602 may be provided with inductors 114. In some embodiments, inductors 114 may be fabricated using magnetic thin-film processes known in the art. At 1208, VR die 104 and passive die 602 may be assembled in wafer form. For example, a plurality of VR dies 104 in a wafer may be bonded substantially simultaneously with a corresponding plurality of passive dies 602 in another wafer. At 1210, this die assembly comprising VR die 104 and passive die 602 may be tested suitably. At 1212, known-good die assembly from the testing may be assembled with load-die 102 in a package, for example, by coupling to package substrate 110, over-molding, etc. to form microelectronic assembly 100.

Figure 13:
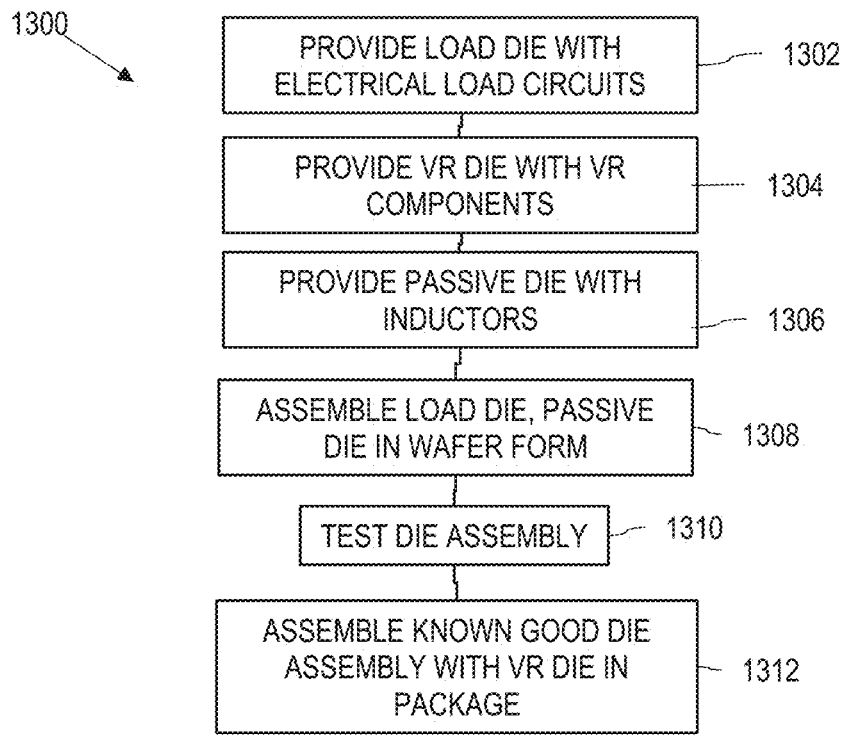
FIG. 13 is a flow diagram of yet another example method of making a microelectronic assembly, according to various embodiments of the present disclosure.

FIG. 13 is a flow diagram of an example method 1300 of fabricating a microelectronic assembly 100, according to various embodiments of the present disclosure, in which in which passive die 602 is substantially similarly sized as load-die 102 (e.g., as shown in FIG. 7). At 1302, load-die 102 may be provided with electrical load circuits 402. At 1304, VR die 104 may be provided with VR components 404. At 1306, passive die 602 may be provided with inductors 114. At 1308, at which load-die 102 may be assembled with passive die 602 in wafer form. For example, a plurality of load-dies 102 in a wafer may be bonded substantially simultaneously with a corresponding plurality of passive dies 602 in another wafer. At 1310, this die assembly comprising load-die 102 and passive die 602 may be tested suitably. At 1312, known-good die assembly from the testing may be assembled with load-die 102 in a package, for example, by coupling to package substrate 110, over-molding, etc. to form microelectronic assembly 100.

Although FIGS. 10-13 illustrates various operations performed in a particular order, this is simply illustrative, and the operations discussed herein may be reordered and/or repeated as suitable. For example, one or more operations may be performed in parallel to manufacture multiple microelectronic assemblies substantially simultaneously. In another example, the operations may be performed in a different order to reflect the structure of a particular microelectronic assembly in which one or more elements as described herein may be included. Numerous other variations are also possible to achieve the desired structure of microelectronic assembly 100.

Furthermore, the operations illustrated in FIGS. 10-13 may be combined or may include more details than described. Still further, additional processes which are not illustrated may also be performed without departing from the scope of the present disclosure. Also, various ones of the operations discussed herein with respect to FIGS. 10-13 may be modified in accordance with the present disclosure to fabricate others of microelectronic assembly 100 disclosed herein. For example, method 1000 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Example Devices and Components

Figure 14:
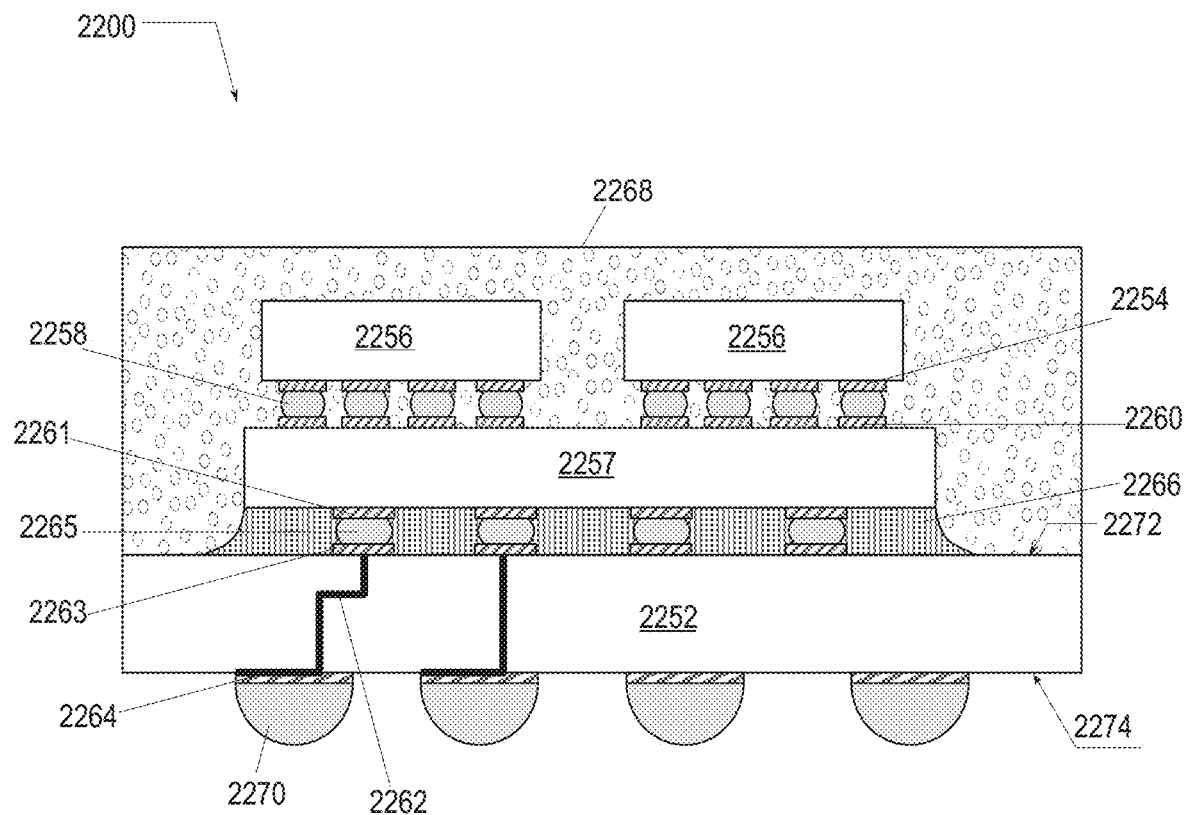
FIG. 14 is a cross-sectional view of a device package that may include one or more IC packages in accordance with any of the embodiments disclosed herein.
Figure 15:
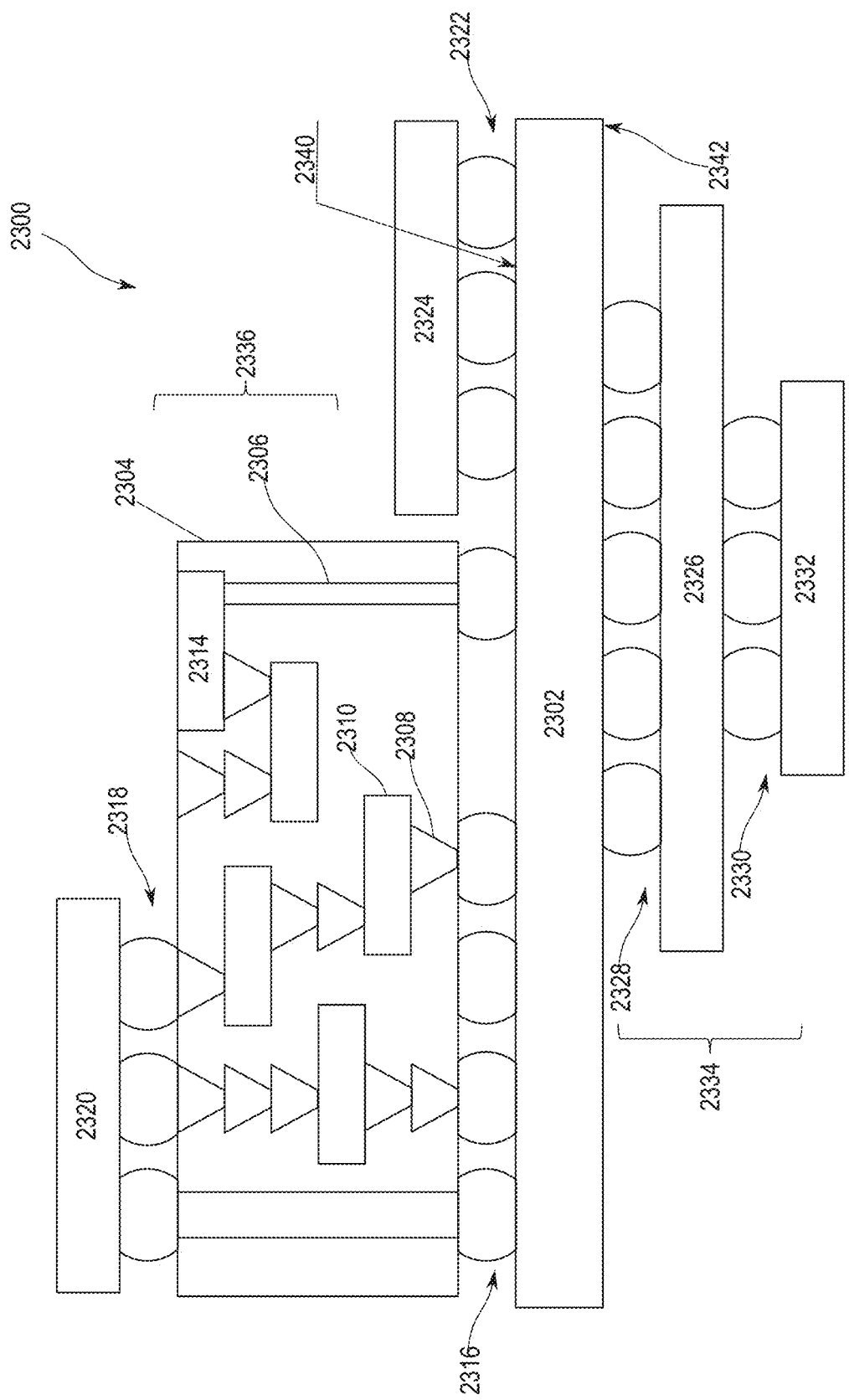
FIG. 15 is a cross-sectional view of a device assembly that may include one or more IC packages in accordance with any of the embodiments disclosed herein.
Figure 16:
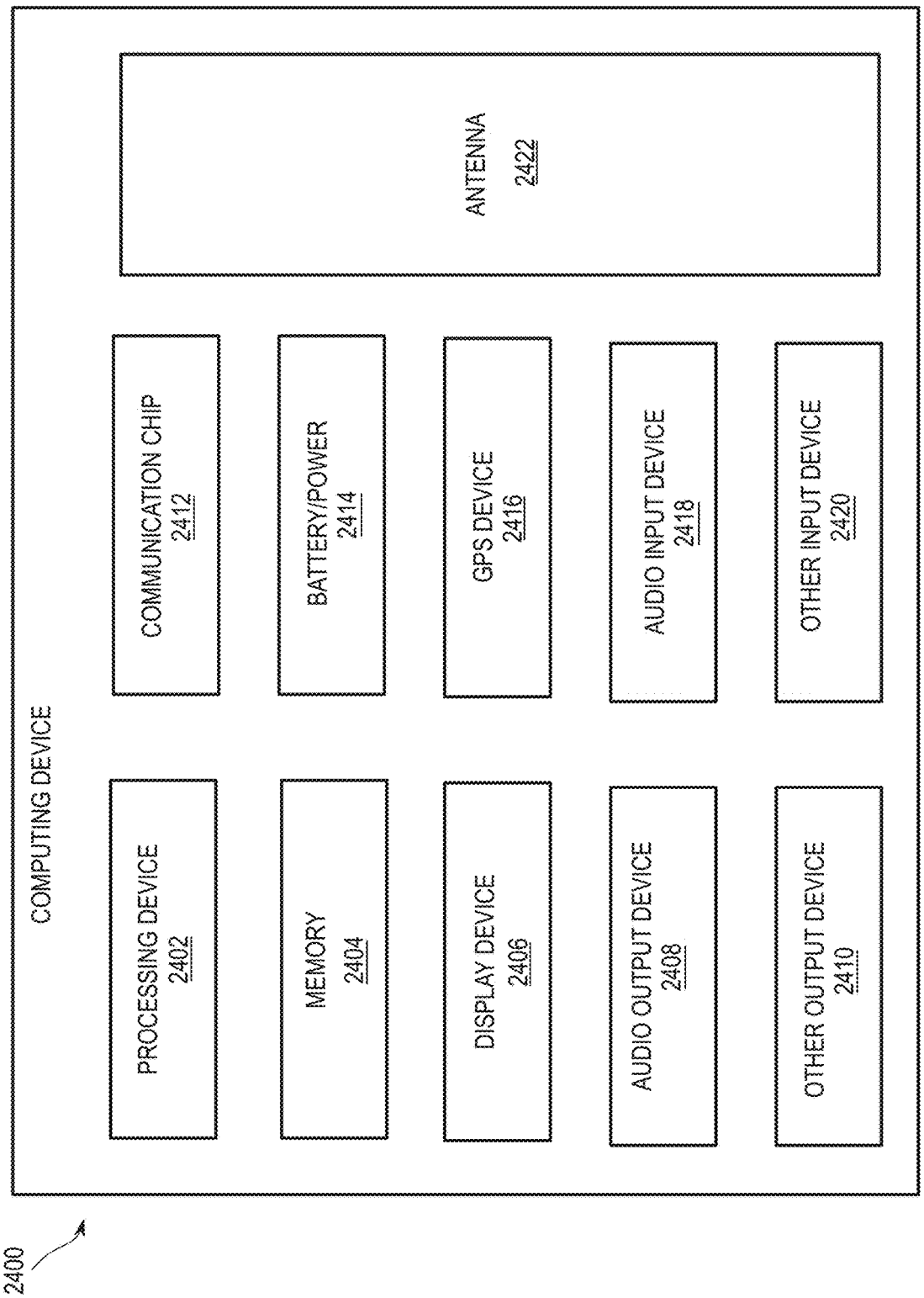
FIG. 16 is a block diagram of an example computing device that may include one or more IC packages in accordance with any of the embodiments disclosed herein.

The packages disclosed herein, e.g., any of the embodiments shown in FIGS. 1-9 or any further embodiments described herein, may be included in any suitable electronic component. FIGS. 14-16 illustrate various examples of packages, assemblies, and devices that may be used with or include any of the IC packages as disclosed herein.

FIG. 14 is a side, cross-sectional view of an example IC package 2200 that may include IC packages in accordance with any of the embodiments disclosed herein. In some embodiments, the IC package 2200 may be a system-in-package (SiP).

As shown in FIG. 14, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 14 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown)

through interposer 2257, allowing circuitry within dies 2256 to electrically couple to various ones of conductive contacts 2261 (or to other devices included in interposer 2257, not shown). First-level interconnects 2258 illustrated in FIG. 14 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 14 are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 15.

In various embodiments, any of dies 2256 may include VR die 104 or passive die 602 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being VR die 104 or passive die 602 as described herein, one or more of dies 2256 may be logic dies (e.g., silicon-based dies), one or more of dies 2256 may be memory dies (e.g., high-bandwidth memory), etc. In some embodiments, at least some of dies 2256 may not include VR die 104 or passive die 602 as described herein.

Although IC package 2200 illustrated in FIG. 14 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 15 is a cross-sectional side view of an IC device assembly 2300 that may include components having one or more microelectronic assembly 200 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 200 in accordance with any of the embodiments disclosed herein; e.g., any of the IC packages discussed below with reference to IC device assembly 2300 may take the form of any of the embodiments of IC package 2200 discussed above with reference to FIG. 14.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 15 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 14. In some embodiments, IC package 2320 may include at least one VR die 104 or passive die 602 as described herein. VR die 104 or passive die 602 is not specifically shown in FIG. 15 in order to not clutter the drawing.

Although a single IC package 2320 is shown in FIG. 15, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 15, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 16 is a block diagram of an example computing device 2400 that may include one or more components having one or more IC packages in accordance with any of the embodiments disclosed herein. For example, any suitable ones of the components of computing device 2400 may include a microelectronic assembly with a VR die (e.g., 104) or passive die (e.g., 602), in accordance with any of the embodiments disclosed herein. In another example, any one or more of the components of computing device 2400 may include any embodiments of IC package 2200 (e.g., as shown in FIG. 14). In yet another example, any one or more of the components of computing device 2400 may include an IC device assembly 2300 (e.g., as shown in FIG. 15).

A number of components are illustrated in FIG. 16 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 16, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408 but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random-access memory (eDRAM) or spin transfer torque magnetic random-access memory (STT-MRAM).

In some embodiments, computing device 2400 may include a communication chip 2412 (e.g., one or more communication chips; note that the terms "chip," "die," and "IC die" are used interchangeably herein). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2", etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an Ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100), comprising: a first IC die (e.g., 102) having an electrical load circuit (e.g., 402); a second IC die (e.g., 104) having a portion of a VR electrically coupled to the first IC die; a package substrate (e.g., 110) having inductors (e.g., 114) of the VR (e.g., 115) electrically coupled to the first IC die and the second IC die; and a mold compound (e.g., 138) between the first IC die and the package substrate. The VR receives power at a first voltage from the package substrate and provides power at a second voltage to the electrical load circuit, the second voltage being lower than the first voltage, and the second IC die is in the mold compound.

Example 2 provides the microelectronic assembly of example 1, further comprising: a third IC die (e.g., 102) having another electrical load circuit; and a fourth IC die (e.g., 122) electrically bridging the first IC die and the third IC die. The fourth IC die is coupled to the first IC die and to the third IC die with respective die-to-die (DTD) interconnects, the fourth IC die is in the mold compound, and the fourth IC die has TSVs (e.g., 128).

Example 3 provides the microelectronic assembly of example 2, in which: the second IC die is electrically coupled to the first IC die with DTD interconnects having a first pitch, the fourth IC die is electrically coupled to the first IC die with DTD interconnects having a second pitch, and the second pitch is smaller than the first pitch.

Example 4 provides the microelectronic assembly of any of examples 2-3, in which the fourth IC die is a passive die without any active elements.

Example 5 provides the microelectronic assembly of any of examples 1-4, in which: active elements in the first IC die are located proximate to the second IC die, and active elements in the second IC die are located proximate to the package substrate.

Example 6 provides the microelectronic assembly of any of examples 1-4, in which: active elements in the first IC die are located proximate to the second IC die, and active elements in the second IC die are located proximate to the first IC die.

Example 7 provides the microelectronic assembly of any of examples 1-6, further comprising TDVs (e.g., 140) in the mold compound.

Example 8 provides the microelectronic assembly of example 7, in which the TDVs electrically couple the first IC die and the package substrate.

Example 9 provides the microelectronic assembly of example 7, in which the TDVs electrically couple the second IC die and the package substrate (e.g., FIG. 3).

Example 10 provides the microelectronic assembly of any of examples 1-9, in which the second IC die comprises TSVs (e.g., 112) configured to deliver power from the package substrate to the first IC die.

Example 11 provides the microelectronic assembly of any of examples 1-10, in which: the inductors are in the package substrate, and the inductors comprise coaxial MIL structures having a conductive through-hole surrounded by a magnetic material.

Example 12 provides the microelectronic assembly of example 11, in which the magnetic material comprises magnetic resin with ferrite particles.

Example 13 provides the microelectronic assembly of any of examples 1-10, in which the inductors comprise embedded magnetic sheets within the package substrate.

Example 14 provides the microelectronic assembly of any of examples 1-10, in which the inductors comprise magnetic inductor arrays surface mounted on the package substrate.

Example 15 provides the microelectronic assembly of any of examples 1-14 (e.g., FIG. 5), in which: the portion of the VR in the second IC die operates at the first voltage, and the first IC die comprises another portion of the VR operating at the second voltage.

Example 16 provides the microelectronic assembly of any of examples 1-15, further comprising a redistribution layer (RDL) (e.g., 202, 304) between the second IC die and the first IC die configured to route current from one area in the RDL to another area in the RDL.

Example 17 provides the microelectronic assembly of example 16, in which the RDL (e.g., 202) is limited to a surface of the second IC die.

Example 18 provides the microelectronic assembly of example 17, in which: the first IC die is larger than the second IC die, and the RDL (e.g., 304) further extends over a surface of the mold compound.

Example 19 provides the microelectronic assembly of any of examples 17-18, in which: the mold compound is comprised in a discrete interposer sized similarly as or larger than the first IC die, and the RDL further extends over a surface of the interposer.

Example 20 provides the microelectronic assembly of any of examples 16-19, in which the RDL is configured for a voltage rail generated by the VR.

Example 21 provides the microelectronic assembly of any of examples 16-19, in which the RDL is configured for a voltage rail generated by components external to the microelectronic assembly.

Example 22 provides the microelectronic assembly of any of examples 1-21, in which the second IC die is electrically coupled to the package substrate with die-to-package substrate (DTPS) interconnects (e.g., 132).

Example 23 provides the microelectronic assembly of example 22, in which the mold compound is comprised in a discrete interposer (e.g., 302).

Example 24 provides the microelectronic assembly of example 23, further comprising DTPS interconnects between the interposer and the package substrate.

Example 25 provides the microelectronic assembly of example 24, further comprising underfill (e.g., 142) around the DTPS interconnects.

Example 26 provides the microelectronic assembly of any of examples 1-25, in which: the package substrate comprises a core (e.g., 116) with conductive pathways (e.g., 118) in metal layers alternating with insulating layers (e.g., 120) having conductive vias, and the inductors are in the core of the package substrate.

Example 27 provides the microelectronic assembly of any of examples 1-25, in which: the package substrate comprises conductive pathways in metal layers alternating with insulating layers having conductive vias without a core, and the inductors are distributed across multiple metal layers and insulating layers of the package substrate.

Example 28 provides the microelectronic assembly of any of examples 1-27, in which a decoupling capacitor is on a side of the package substrate opposite to the second IC die.

Example 29 provides an IC, comprising: a portion of a VR in an IC die (e.g., 104); and inductors (e.g., 114) in a package substrate (e.g., 110), in which: the VR receives power at a first voltage and provides power at a second voltage to an electrical load circuit in another IC die (e.g., 102), the second voltage being lower than the first voltage, and the IC die is in an interposer (e.g., 302).

Example 30 provides the IC of example 29, in which the interposer comprises mold compound (e.g., 138) and TDVs (e.g., 140).

Example 31 provides the IC of any of examples 29-30, in which: the portion of the VR in the IC die operates at the first voltage, and another portion of the VR operating at the second voltage is in the another IC die.

Example 32 provides the IC of any of examples 29-31, further comprising electrical connections to the package substrate from the another IC die through TSVs in the IC die.

Example 33 provides the IC of any of examples 29-31, further comprising electrical connections to the package substrate from the another IC die through TDVs in the interposer.

Example 34 provides the IC of any of examples 29-33, further comprising electrical connections through a RDL on a surface of the IC die proximate to the another IC die.

Example 35 provides the IC of any of examples 29-33, further comprising electrical connections through a RDL on a surface of the interposer proximate to the another IC die.

Example 36 provides the IC of any of examples 29-35, further comprising a decoupling capacitor on an input side of the IC, wherein the decoupling capacitor is on a side of the package substrate opposite to the IC die.

Example 37 provides the IC of example 36, in which the decoupling capacitor is a surface mounted component.

Example 38 provides the IC of any of examples 29-37, in which the inductors comprise coaxial MIL structures in a core of the package substrate.

Example 39 provides the IC of any of examples 29-38, in which the package substrate comprises conductive pathways in metal layers and insulating layers with conductive vias electrically coupling the metal layers.

Example 40 provides a method comprising: providing a first IC die with an electrical load circuit; providing a second IC die with a portion of a VR; providing inductors in a package substrate; and electrically coupling the first IC die, the second IC die and the inductors to generate a VR. The VR converts power delivered to the package substrate at a first voltage to a second voltage delivered to the electrical load circuit, the first voltage being higher than the second voltage.

Example 41 provides the method of example 40, further comprising providing another portion of the VR in the first IC die, wherein the portion of the VR in the second IC die operates at the first voltage, and the another portion operates at the second voltage.

Example 42 provides the method of any of examples 40-41, further comprising: providing a third IC die having electrical load circuits; providing a fourth IC die having TSVs; electrically coupling the third IC die to the first IC die with the fourth IC die.

Example 43 provides the method of any of examples 40-42, further comprising providing a RDL on the second IC die. The RDL comprises conductive traces to route electrical signals from one area of the RDL to another area of the RDL.

Example 44 provides the method of any of examples 40-43, further comprising providing mold compound around the second IC die.

Example 45 provides the method of example 44, in which the providing mold compound comprises depositing the mold compound in liquid form around the second IC die and curing.

Example 46 provides the method of any of examples 44-45, further comprising providing TDVs in the mold compound.

Examples 47 provides the method of example 46, in which the TDVs comprise copper pillars.

Example 48 provides the method of any of examples 44-47, in which: the mold compound and the second IC die are comprised in a discrete interposer, the interposer is similarly sized as or larger than the first IC die, and the interposer is coupled to the first IC die with DTD interconnects and to the package substrate with DTPS interconnects.

Example 49 provides the method of example 48, further comprising providing a RDL on the interposer. The RDL comprises conductive traces to route electrical signals from one area of the RDL to another area of the RDL.

Example 50 provides the method of any of examples 48-49, further comprising: providing a third IC die having electrical load circuits; providing a fourth IC die having TSVs in the interposer; and electrically coupling the third IC die to the first IC die with the fourth IC die.

Example 51 provides a microelectronic assembly (e.g., 100 in FIG. 6), comprising: a first IC die (e.g., 102) having an electrical load circuit (e.g., 402); a second IC die (e.g., 104) having a portion of a VR (e.g., 115); and a third IC die (e.g., 602) comprising inductors of the VR. The third IC die is between the first IC die and the second IC die, and the VR is configured to receive power at a first voltage and to provide power at a second voltage to the electrical load circuit, the second voltage being lower than the first voltage.

Example 52 provides the microelectronic assembly of example 51, in which the inductors in the third IC die comprise magnetic thin films.

Example 53 provides the microelectronic assembly of any of examples 51-52, wherein the third IC die is a passive die without any active elements.

Example 54 provides the microelectronic assembly of any of examples 51-53, further comprising a package substrate (e.g., 110) having conductive pathways (e.g., 118), in which the second IC die is between the third IC die and the package substrate.

Example 55 provides the microelectronic assembly of example 54, in which the package substrate comprises a fourth IC die (e.g., FIG. 9).

Example 56 provides the microelectronic assembly of any of examples 54-55, in which the package substrate comprises conductive pathways in metal layers and organic insulating layers with conductive vias electrically coupling the metal layers.

Example 57 provides the microelectronic assembly of any of examples 54-56, further comprising a mold compound (e.g., 138) between the first IC die and the package substrate, the second IC die and the third IC die being in the mold compound.

Example 58 provides the microelectronic assembly of example 57, further comprising TDVs in the mold compound.

Example 59 provides the microelectronic assembly of any of examples 54-58, in which: the first IC die is electrically coupled to the package substrate with a first plurality of interconnects, the second IC die is electrically coupled to the package substrate with a second plurality of interconnects, and the first plurality of interconnects and the second plurality of interconnects are of different types.

Example 60 provides the microelectronic assembly of any of examples 54-59, further comprising decoupling capacitors mounted on the package substrate.

Example 61 provides the microelectronic assembly of any of examples 51-60, in which: the third IC die is electrically coupled to the first IC die with a first plurality of interconnects, and the third IC die is electrically coupled to the second IC die with a second plurality of interconnects.

Example 62 provides the microelectronic assembly of example 61, in which the first plurality of interconnects is of a same type as the second plurality of interconnects.

Example 63 provides the microelectronic assembly of any of examples 51-12, in which the third IC die is similarly sized as the second IC die (e.g., FIG. 6).

Example 64 provides the microelectronic assembly of example 63, in which the first IC die further comprises decoupling MIM capacitors.

Example 65 provides the microelectronic assembly of any of examples 51-64, in which the third IC die is similarly sized as the first IC die (e.g., FIG. 7).

Example 66 provides the microelectronic assembly of example 65, in which the third IC die further comprises decoupling MIM capacitors.

Example 67 provides the microelectronic assembly of any of examples 51-66, in which the inductors are stacked within the third IC die (e.g., FIG. 9).

Example 68 provides the microelectronic assembly of any of examples 51-67, in which the inductors comprise multiple turns in a direction along a thickness of the third IC die.

Example 69 provides the microelectronic assembly of any of examples 51-68, in which the portion of the VR in the second IC die includes power train, drivers, and controller.

Example 70 provides the microelectronic assembly of any of examples 51-69, in which the portion of the VR in the second IC die includes power train and drivers, and another portion of the VR comprising a controller is in the first IC die.

Example 71 provides the microelectronic assembly of any of examples 51-70, further comprising a stacked arrangement of multiple ones of the microelectronic assembly (e.g., FIG. 8). At least some of the first IC dies in the stacked arrangement comprise TSVs.

Example 72 provides the microelectronic assembly of example 72, in which the second IC die further comprises TSVs electrically coupling two opposing faces of the second IC die.

Example 73 provides an IC, comprising: an electrical load circuit in a first IC die (e.g., 102); a portion of a VR in a second IC die (e.g., 104); and inductors (e.g., 114) in a third IC die (e.g., 602). The VR is configured to receive power at a first voltage and to provide power at a second voltage to the electrical load circuit, the second voltage being lower than the first voltage.

Example 74 provides the IC of example 73, in which the third IC die is between the first IC die and the second IC die.

Example 75 provides the IC of any of examples 73-74, in which the second IC die and the third IC die are comprised in an interposer.

Example 76 provides the IC of example 75, in which the interposer comprises mold compound (e.g., 138) and TDVs (e.g., 140).

Example 77 provides the IC of example 76, further comprising electrical connections between a package substrate and the first IC die with the TDVs in the interposer.

Example 78 provides the IC of any of examples 73-77, in which the portion of the VR in the second IC die operates at the first voltage, and another portion of the VR operating at the second voltage is in the first IC die.

Example 79 provides the IC of any of examples 73-78, further comprising electrical connections with TSVs between two opposing sides of the second IC die.

Example 80 provides the IC of any of examples 73-79, in which the package substrate comprises conductive pathways in metal layers and insulating layers with conductive vias electrically coupling the metal layers.

Example 81 provides a method comprising: providing a first IC die with an electrical load circuit; providing a second IC die with a portion of a VR; providing a third IC die with inductors; and electrically coupling the first IC die, the second IC die and the third IC die to generate a VR. The VR is configured to convert power received at a first voltage into power delivered at a second voltage to the electrical load circuit, the first voltage being higher than the second voltage.

Example 82 provides the method of example 81, further comprising providing another portion of the VR in the first IC die. The portion of the VR in the second IC die is configured to operate at the first voltage, and the another portion is configured to operate at the second voltage.

Example 83 provides the method of any of examples 81-82, in which the inductors comprise magnetic thin films.

Example 84 provides the method of any of examples 81-83, in which the electrical coupling comprises: assembling the second IC die and the third IC die in wafer form; testing the die assembly to obtain a known-good die assembly; and assembling the known-good die assembly with the first IC die in a package.

Example 85 provides the method of example 84, in which the first IC die is provided with decoupling MIM capacitors.

Example 86 provides the method of any of examples 81-85, in which the electrical coupling comprises: assembling the first IC die and the third IC die in wafer form; testing the die assembly to obtain a known-good die assembly; and assembling the known-good die assembly with the second IC die in a package.

Example 87 provides the method of example 86, in which the third IC die is provided with decoupling MIM capacitors.

Example 88 provides the method of any of examples 81-87, in which the third IC die does not contain any active elements.

Example 89 provides the method of any of examples 81-88, in which the third IC die comprises multiple inductors stacked one on top of another.

Example 90 provides the method of any of examples 91-99, further comprising assembling a stack of microelectronic assemblies one on top of another, each microelectronic assembly comprising the third IC die between the first IC die and the second IC die.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
   a first integrated circuit (IC) die having an electrical load circuit;
   a second IC die having a portion of a voltage regulator (VR), wherein:
      the second IC die has a first side facing the first IC die and a second side opposite the first side,
      the first side comprises first conductive contacts, and
      the second side comprises second conductive contacts; and
   a third IC die comprising inductors of the VR; wherein:
      the third IC die is between the first IC die and the second IC die,
      the third IC die has a third side facing the second IC die and a fourth side facing the first IC die,
      the third side comprises third conductive contacts coupled with the second conductive contacts,
      the fourth side comprises fourth conductive contacts coupled with fifth conductive contacts of the first IC die, and
      the VR is configured to receive power at a first voltage and to provide power at a second voltage to the electrical load circuit, the second voltage being lower than the first voltage.

2. The microelectronic assembly of claim 1, wherein the inductors in the third IC die comprise magnetic thin films.

3. The microelectronic assembly of claim 1, further comprising:
   a package substrate having conductive pathways, wherein:
      the second IC die is between the third IC die and the package substrate,
      the package substrate comprises sixth conductive contacts, and
      the first conductive contacts on the first side of the second IC die are coupled with the sixth conductive contacts.

4. The microelectronic assembly of claim 3, further comprising a mold compound between the first IC die and the package substrate, wherein the second IC die and the third IC die are in the mold compound.

5. The microelectronic assembly of claim 4, further comprising through-dielectric vias (TDVs) in the mold compound and coplanar with the second IC die.

6. The microelectronic assembly of claim 3, wherein:
   the first IC die is electrically coupled to the package substrate with a first plurality of interconnects,
   the second IC die is electrically coupled to the package substrate with a second plurality of interconnects, and
   the first plurality of interconnects and the second plurality of interconnects are of different types.

7. The microelectronic assembly of claim 1, wherein the third IC die is similarly sized as the second IC die, and the first IC die further comprises decoupling metal-insulator-metal (MIM) capacitors.

8. The microelectronic assembly of claim 1, wherein the third IC die is similarly sized as the first IC die, and the third IC die further comprises decoupling MIM capacitors.

9. The microelectronic assembly of claim 1, wherein the inductors are stacked within the third IC die.

10. The microelectronic assembly of claim 1, wherein the portion of the VR in the second IC die includes power train and drivers, and another portion of the VR comprising a controller is in the first IC die.

11. The microelectronic assembly of claim 1, further comprising a stacked arrangement of multiple ones of the microelectronic assembly, wherein at least some of the first IC dies in the stacked arrangement comprise through-silicon vias (TSVs).

12. The microelectronic assembly of claim 1, wherein the second IC die further comprises TSVs electrically coupling two opposing faces of the second IC die.

13. The microelectronic assembly of claim 1, further comprising:
a mold compound at least partially around the second die and the third die.

14. An integrated circuit (IC), comprising:
an electrical load circuit in a first IC die;
a portion of a voltage regulator (VR) in a second IC die; and
inductors in a third IC die, wherein:
the third die has a first side coupled with the first IC die and a second side coupled with the second IC die,
a mold compound is at least partially surrounding the second die and the third die, and
the VR is configured to receive power at a first voltage and to provide power at a second voltage to the electrical load circuit, the second voltage being lower than the first voltage.

15. The IC of claim 14, wherein the third IC die is between the first IC die and the second IC die.

16. The IC of claim 14, wherein:
the second IC die and the third IC die are comprised in an interposer,
the interposer comprises the mold compound and a through-dielectric via (TDV) in the mold compound between the first IC die and a package substrate, and
the TDV is coplanar with the second IC die and the third IC die.

17. The IC of claim 14, wherein:
the first side comprises first conductive contacts coupled with first corresponding conductive contacts of the first IC die, and
the second side comprises second conductive contacts coupled with second corresponding conductive contacts of the second die.

18. A method comprising:
providing a first IC die with an electrical load circuit;
providing a second IC die with a portion of a voltage regulator (VR);
providing a third IC die with inductors; and
electrically coupling the first IC die, the second IC die and the third IC die to generate the VR, wherein the VR is configured to convert power received at a first voltage into power delivered at a second voltage to the electrical load circuit, the first voltage being higher than the second voltage, and wherein:
the third IC die has a first face comprising first conductive contacts and a second face comprising second conductive contacts, and
electrically coupling the first IC die, the second IC die, and the third IC die comprises coupling the first conductive contacts with first corresponding conductive contacts of the first IC die and coupling the second conductive contacts with second corresponding conductive contacts of the second die.

19. The method of claim 18, further comprising providing another portion of the VR in the first IC die, wherein the portion of the VR in the second IC die is configured to operate at the first voltage, and the another portion is configured to operate at the second voltage.

20. The method of claim 18, further comprising assembling a stack of microelectronic assemblies one on top of another, each microelectronic assembly comprising the third IC die between the first IC die and the second IC die.

* * * * *